(12) United States Patent
Kwon et al.

(10) Patent No.: US 7,452,773 B2
(45) Date of Patent: Nov. 18, 2008

(54) METHOD OF MANUFACTURING A FLASH MEMORY DEVICE

(75) Inventors: Sung-Un Kwon, Hwaseong-si (KR); Yong-Sun Ko, Suwon-si (KR); Jae-Seung Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 341 days.

(21) Appl. No.: 11/449,848

(22) Filed: Jun. 9, 2006

(65) Prior Publication Data
US 2006/0292795 A1 Dec. 28, 2006

(30) Foreign Application Priority Data
Jun. 28, 2005 (KR) ............ 10-2005-0056191

(51) Int. Cl.
*H01L 21/336* (2006.01)
(52) U.S. Cl. ............ 438/257; 257/314; 257/315; 257/E21.682
(58) Field of Classification Search ........... None
See application file for complete search history.

(56) References Cited

U.S. PATENT DOCUMENTS 6,023,085 A 2/2000 Fang
2004/0145007 A1* 7/2004 Sumino et al. ............ 257/315
2005/0029573 A1* 2/2005 Sato et al. ............ 257/314

FOREIGN PATENT DOCUMENTS

| JP | 10-074914 | 3/1998 |
|----|-----------|--------|
| KR | 10-0268894 | 7/2000 |
| KR | 10-0466190 | 1/2005 |

* cited by examiner

*Primary Examiner*—Thanh V. Pham
*Assistant Examiner*—Shaka Scarlett
(74) *Attorney, Agent, or Firm*—Volentine & Whitt, PLLC

(57) ABSTRACT

In a method of manufacturing a flash memory device, an insulation layer pattern is formed on a substrate having cell and peripheral regions. Trenches formed in the substrate are converted into trench structures. A tunnel oxide layer is formed on the substrate. A space between the trench structures is filled with a first conductive layer. The trench structures are removed to form trench isolation structures and to convert the first conductive layer into a first conductive layer pattern. A dielectric layer is formed on the first conductive layer patterns and the trench isolation structures. An insulation layer is formed on the substrate in the peripheral region. A third conductive layer is formed on the second conductive layer, the insulation layer and the trench isolation layers. First and second gate structures are formed in the cell region and the peripheral region, respectively.

20 Claims, 18 Drawing Sheets

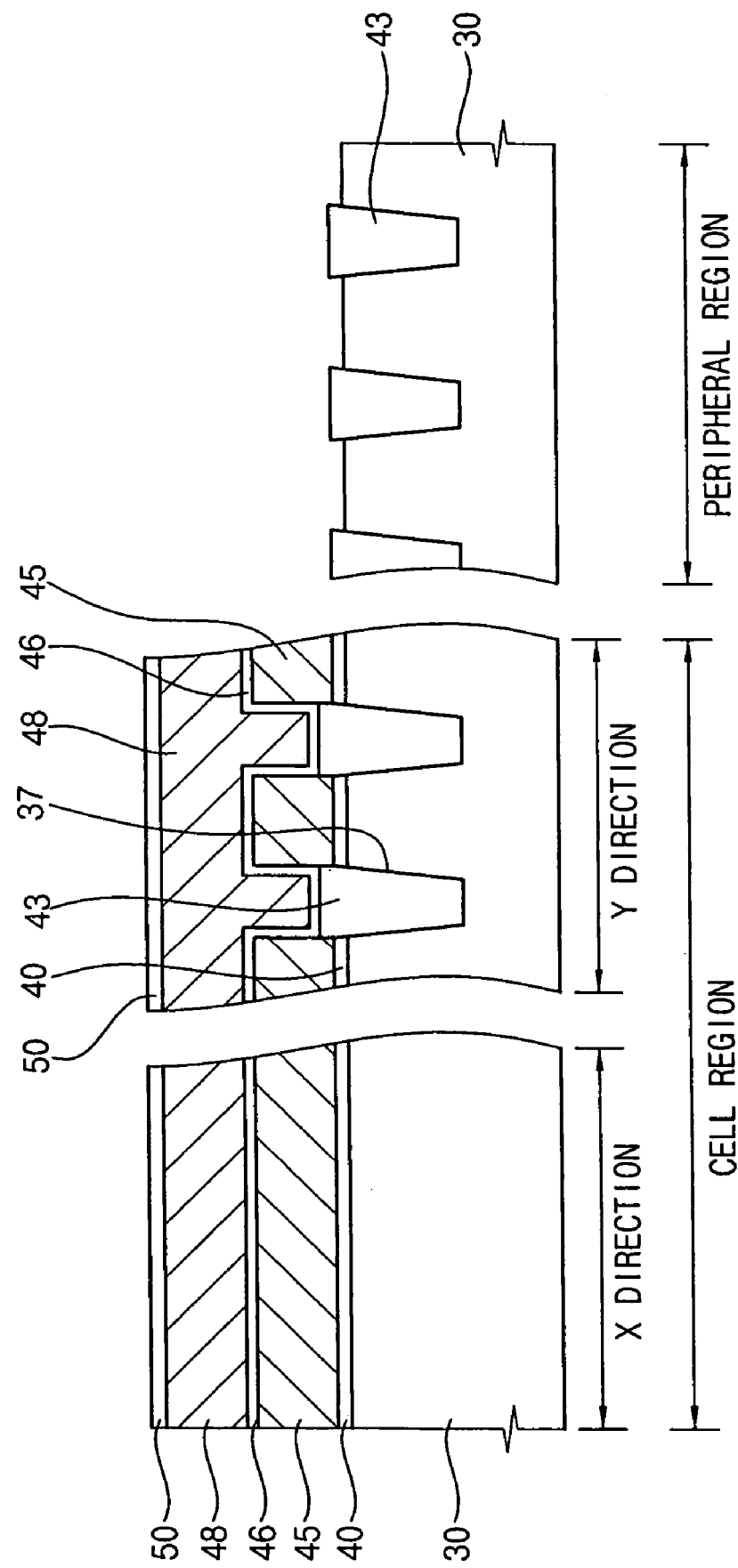

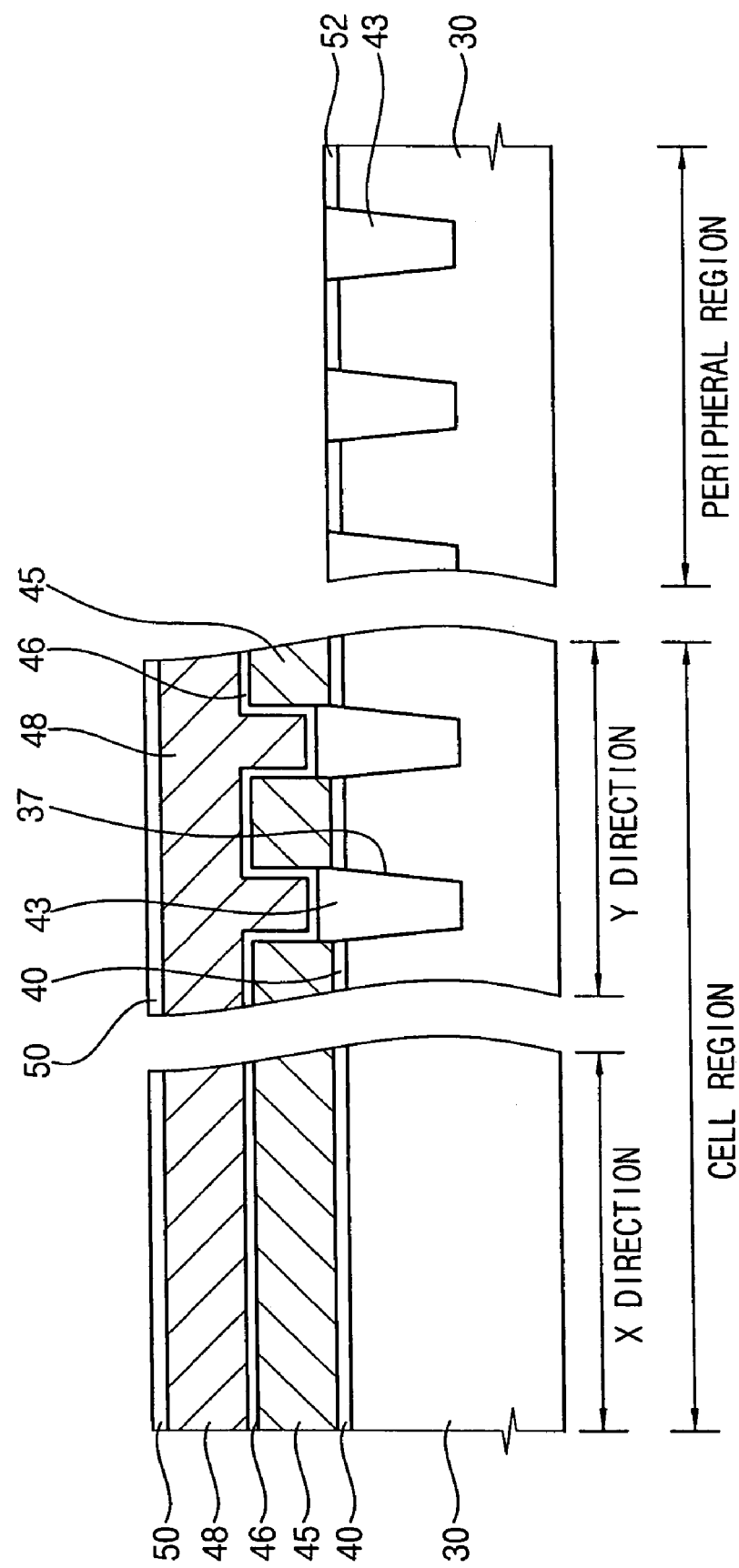

METHOD OF MANUFACTURING A FLASH MEMORY DEVICE

BACKGROUND OF THE INVENTION

1. Field of the Invention

Embodiments of the invention relate to a method of manufacturing a semiconductor device. More particularly, embodiments of the invention relate to a method of manufacturing a flash memory device adapted to continuously input and output data regardless of relative time lapses.

This application claims priority under 35 USC § 119 to Korean Patent Application No. 2005-56191 filed on Jun. 28, 2005, the subject matter of which is hereby incorporated by reference in its entirety.

2. Description of the Related Art

Conventional flash memory devices generally include a first gate structure adapted for use in a cell region, and a second gate structure adapted for use in a peripheral region. The first gate structure includes a tunnel oxide layer, a floating gate electrode, a dielectric layer pattern and a control gate electrode sequentially formed over a channel region selectively formed in the surface of a semiconductor substrate. The second gate structure has a structure analogous to conventional high voltage or low voltage transistors, and generally includes a gate insulation layer and a gate conductive layer sequentially formed over a channel region.

U.S. Pat. No. 6,023,085 discloses one example of a flash memory device incorporating these dual gate structures. FIGS. 1A to 1D are cross sectional views illustrating an exemplary method of manufacturing a conventional flash memory device having a dual gate structure.

Referring to FIG. 1A, a semiconductor substrate 10 having a cell region and a peripheral region is prepared. A shallow trench isolation (STI) process is carried out to form a trench isolation layer 12 in the semiconductor substrate 10. A first thin layer 16 adapted for use as part of the floating gate electrode is also formed. A tunnel oxide layer 14 is interposed between the first thin layer 16 and the semiconductor substrate 10. A dielectric layer 18 is then formed on the first thin layer 16 and the trench isolation layer 12.

A second thin layer 20 adapted for use as part of the control gate electrode is formed on the dielectric layer 18. The second thin layer 20 may be formed from a doped polysilicon layer having defined electrical characteristics (e.g., conductivity), as compared to those of an undoped polysilicon layer. A middle temperature oxide (MTO) layer 22 and a hard mask layer 24 formed from silicon nitride are sequentially formed on the second thin layer 20 to complete the control gate electrode.

Referring to FIG. 1B, the hard mask layer 24, the MTO layer 22, the second thin layer 20, the dielectric layer 18, the first thin layer 16, a portion of the trench isolation layer 12, and the tunnel oxide layer 14 are selectively removed from the peripheral region.

Referring to FIG. 1C, a third thin layer 25 adapted for use as a gate insulation layer is formed between the trench isolation layers 24 on the semiconductor substrate 10 in the peripheral region. An undoped polysilicon layer 26 is then formed on the hard mask layer 22 in the cell region, and on the third thin layer 24 and the trench isolation layer 12 in the peripheral region. Here, since a transistor formed in the peripheral region may be an NMOS transistor or a PMOS transistor, the undoped polysilicon layer 26 is used, in contrast to the doped second thin layer 20 adapted for use as part of the control gate electrode. Thus, an ion implantation process may be selectively performed on the undoped polysilicon layer 26 to form an NMOS transistor or a PMOS transistor in the peripheral region.

However, the undoped polysilicon layer 26 is generally formed with a very high step profile at the interface between the cell region and the peripheral region. This dramatic step different (e.g., very different material layer thicknesses over the two regions) may cause problems during subsequently performed fabrication processes.

Thus, as shown in FIG. 1D, the stepped portion of the undoped polysilicon layer 26 is removed by an etching process. After the hard mask layer 24 and the MTO layer 22 in the cell region are removed, the cell region and the peripheral region are patterned to form a first gate structure in the cell region and a second gate structure in the peripheral region. The first gate structure comprises a tunnel oxide layer, a floating gate electrode, a dielectric layer pattern and a control gate electrode. The second gate structure comprises a gate insulation layer and a gate conductive layer. A metal silicide layer is then formed on the control gate electrode of the first gate structure, the gate conductive layer of the second gate structure, and the semiconductor substrate.

There are several problems associated with the foregoing conventional method. For example, as shown in FIG. 2, foreign substances, such as particles lifted various fabrication processes may accumulate in the interface void formed by the removal of the stepped portion of the undoped polysilicon layer. Additionally, the removal of the stepped portion of the undoped polysilicon layer requires that an undoped polysilicon layer adapted for use as part of the control gate electrode be formed on the cell region and the peripheral region. Impurities must then be implanted only on the cell region using ion implantation process. However, since such impurities may not be sufficiently implanted into the polysilicon layer between the floating gate electrodes of the cell region, the desired conductive properties may not be obtained.

SUMMARY OF THE INVENTION

Embodiments of the invention provide a method of manufacturing a flash memory device having stepped portion of a polysilicon layer with sufficiently reduced height such that an interface formed between a cell region and a peripheral region does not suffer from the foregoing drawbacks.

Thus, in one embodiment, the invention provides a method of manufacturing a flash memory device, comprising; forming an insulation layer pattern on a substrate comprising a cell region and a peripheral region, the insulation layer pattern comprising openings selectively exposing portions of the substrate, etching the exposed portions of the substrate to form trenches, filling the trenches with an insulation material to form trench structures, removing the insulation layer pattern to expose the surface of the substrate between the trench structures, forming a tunnel oxide layer on the exposed surface of the substrate, filling a gap space between the trench structures by forming a first conductive layer on the tunnel oxide layer, partially removing the trench structures to form trench isolation structures and to form a conductive layer pattern from the first conductive layer, forming a dielectric layer on the first conductive layer pattern and the trench isolation structures, forming a doped second conductive layer on the dielectric layer to fill gap space between adjacent elements in the first conductive layer pattern, removing the second conductive layer, the dielectric layer, the first conductive layer pattern and the tunnel oxide layer in the peripheral region to expose the surface of the substrate, forming an insulation layer on the exposed surface of the substrate in the peripheral region, forming an un-doped third conductive layer on the second conductive layer in the cell region, and on the insulation layer and the trench isolation structures in the peripheral region, and forming a first gate structure in the cell region and a second gate structure in the peripheral region, wherein the first gate structure comprises the tunnel oxide layer, a floating gate electrode corresponding to the first conductive layer pattern, a dielectric layer pattern, and a control gate electrode comprising the second and third conductive layers, and the second gate structure comprising a gate insulation layer corresponding to the insulation layer and a gate conductive layer comprising the third conductive layer.

In one related aspect, a capping insulation layer is formed on the second conductive layer in the cell region. In another aspect, a metal silicide layer is formed on the control gate electrode of the first gate structure, the gate conductive layer of the second gate structure.

In another embodiment, the invention provides a method of manufacturing a flash memory device, comprising; forming an insulation layer pattern on a substrate comprising a cell region and a peripheral region, the insulation layer pattern comprising openings selectively exposing portions of the substrate, etching the exposed portions of the substrate to form trenches, filling the trenches with an insulation material to form trench structures, removing the insulation layer pattern to expose the surface of the substrate between the trench structures, forming a tunnel oxide layer on the exposed surface of the substrate, filling a gap space between the trench structures by forming a first conductive layer on the tunnel oxide layer, partially removing the trench structures to form trench isolation structures and to form a conductive layer pattern from the first conductive layer, forming a dielectric layer on the first conductive layer pattern and the trench isolation structures, forming a doped second conductive layer on the dielectric layer to fill gap space between adjacent elements in the first conductive layer pattern, removing the second conductive layer, the dielectric layer, the first conductive layer pattern and the tunnel oxide layer in the peripheral region to expose the surface of the substrate, forming an insulation layer on the exposed surface of the substrate in the peripheral region, forming an un-doped third conductive layer on the second conductive layer in the cell region, and on the insulation layer and the trench isolation structures in the peripheral region, forming a first gate structure in the cell region and a second gate structure in the peripheral region, wherein the first gate structure comprises the tunnel oxide layer, a floating gate electrode corresponding to the first conductive layer pattern, a dielectric layer pattern, and a control gate electrode comprising the second and third conductive layers, and the second gate structure comprising a gate insulation layer corresponding to the insulation layer and a gate conductive layer comprising the third conductive layer, doping the control gate and the gate conductive layer with impurities, and forming a silicon nitride capping insulation layer on the second conductive layer in the cell region.

BRIEF DESCRIPTION OF THE DRAWINGS

Several embodiments of the invention will be described with reference to the accompanying drawings. In the drawings, the size and relative sizes of the various layers and regions may be exaggerated for clarity. Throughout the drawings and related portions of the written description, like reference numbers are used to indicate like or similar elements. In the drawings.

DESCRIPTION OF EXEMPLARY EMBODIMENTS

Figure 1A:
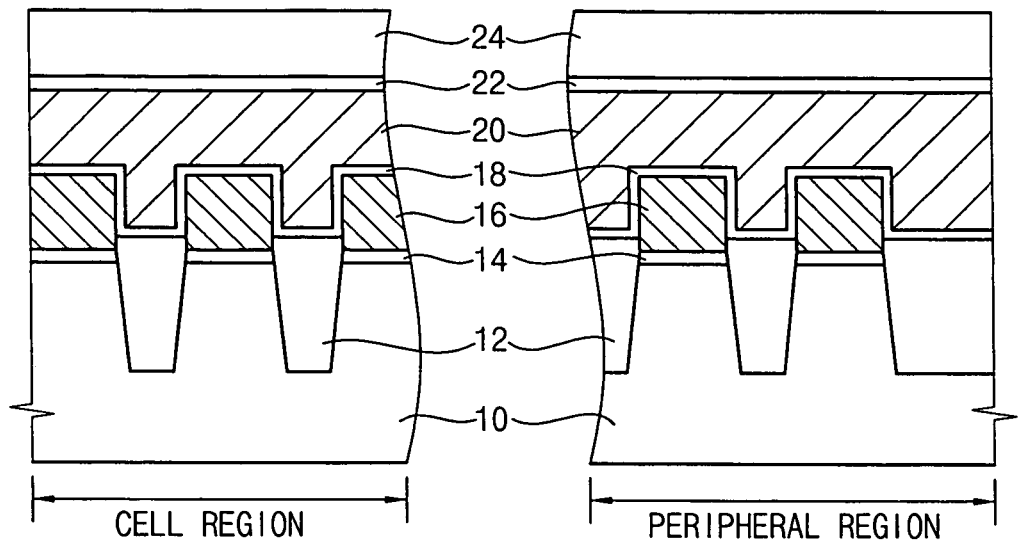
FIGS. 1A through 1D are related cross sectional views illustrating a conventional method of manufacturing a flash memory device.
Figure 1B:
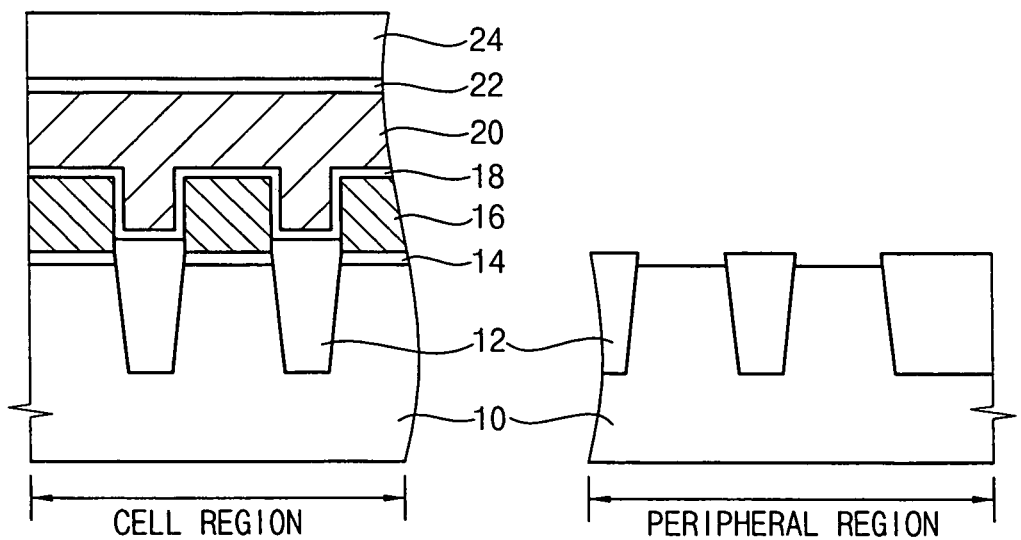
Figure 1C:
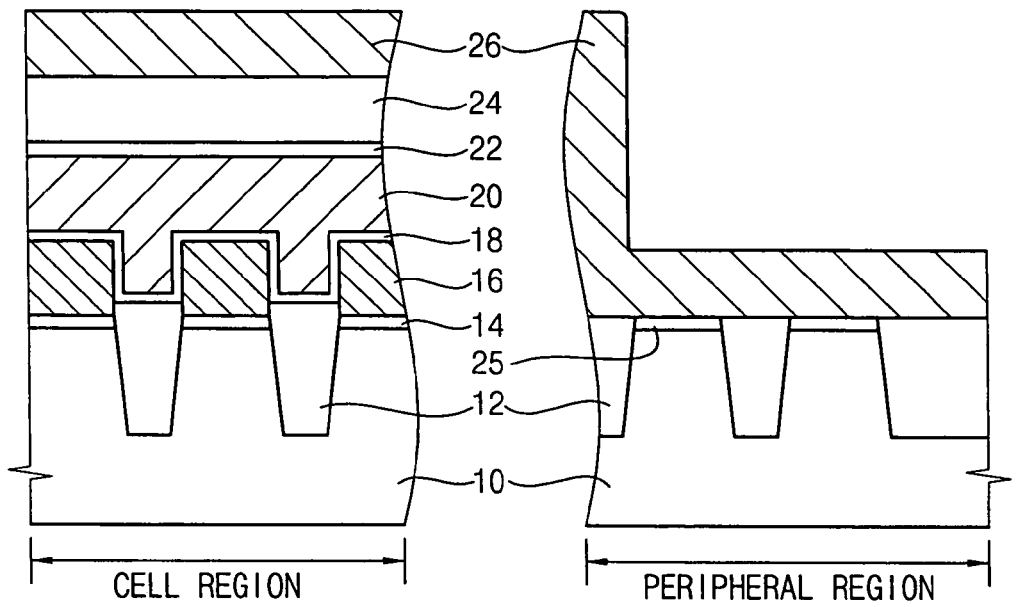
Figure 1D:
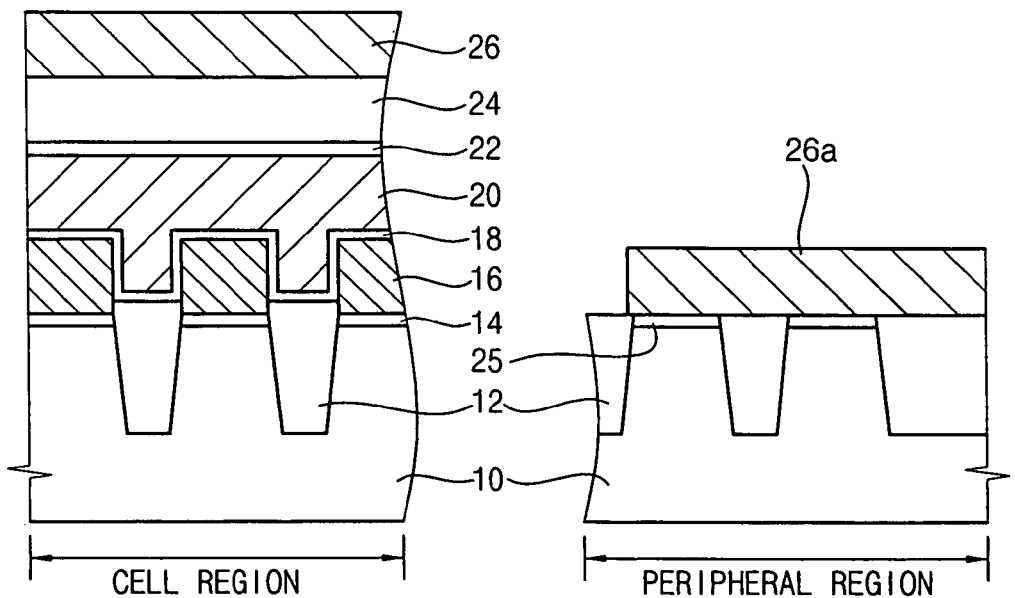
Figure 2:
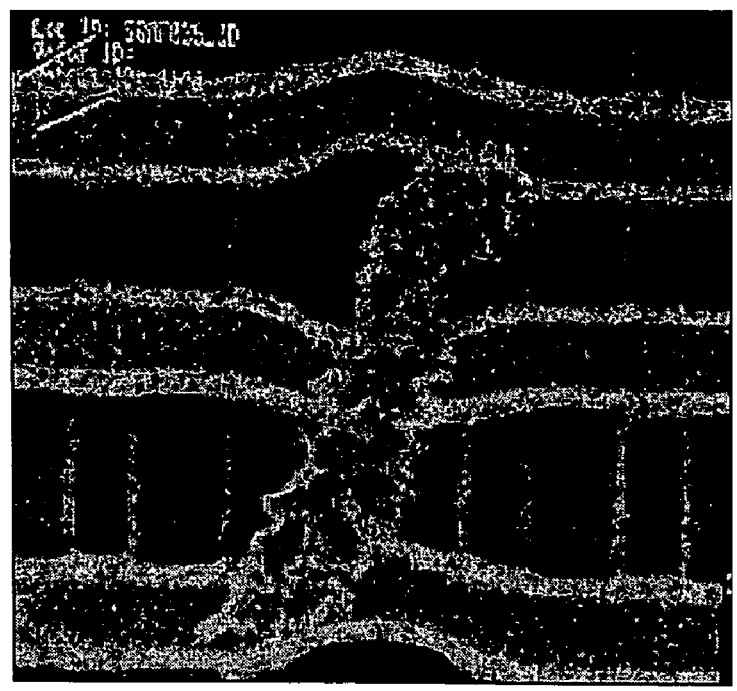
FIG. 2 is an Scanning Electron Microscope (SEM) image showing defects generated by the conventional manufacturing method illustrated in FIGS: 1A through 1D.

Embodiments of the invention will be described with reference to the accompanying drawings. However, the invention may be variously embodied in many different forms and should not be construed as being limited to only the illustrated embodiments. Rather, these embodiments presented as teaching examples.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
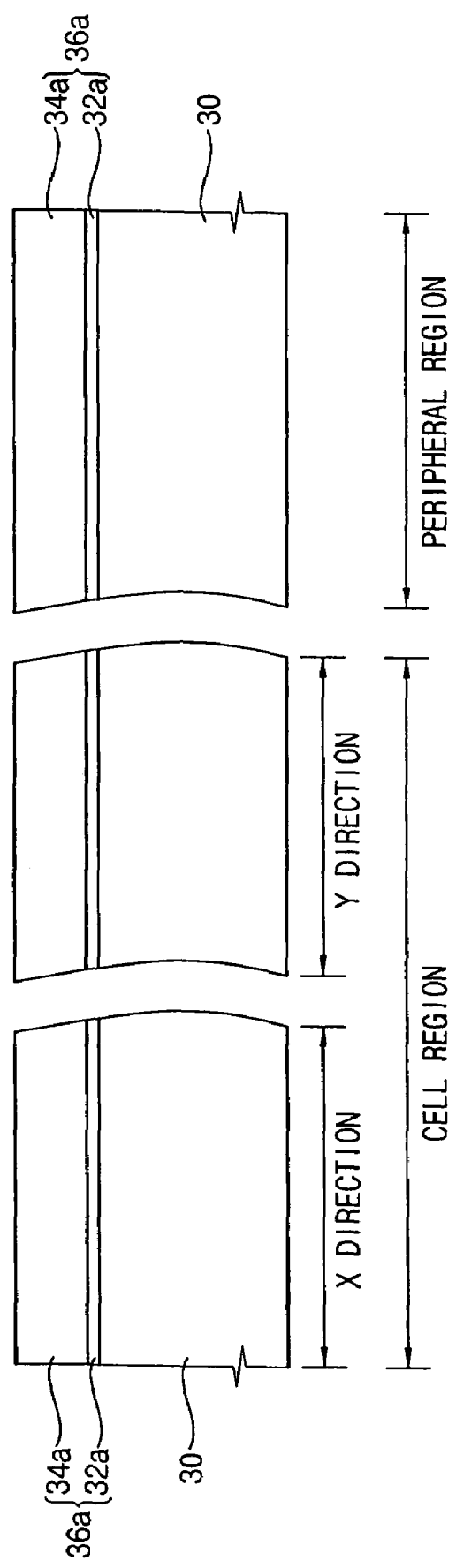
FIGS. 3A through 3O are related cross sectional views illustrating a method of manufacturing a flash memory device in accordance with an embodiment of the invention.

FIGS. 3A to 3O are related cross sectional views illustrating a method of manufacturing a flash memory device in accordance with an embodiment of the invention. In FIGS. 3A to 3O, an arbitrarily selected "X direction" is defined as being substantially perpendicular to a corresponding "Y direction." Further, in the illustrated examples the peripheral region in FIGS. 3A to 3O will be assumed to have an orientation substantially similar to that of a cell region in the Y direction. These relative orientations are, however, merely exemplary.

Referring to FIG. 3A, a cell region and a peripheral region are provided in a semiconductor substrate 30. Possible examples of the semiconductor substrate 30 include a silicon substrate, a silicon-on-insulator (SOI) substrate, etc.

An insulation layer 36a, comprising, for example, sequentially stacked a silicon oxide layer 32a and a silicon nitride layer 34a, is formed on semiconductor substrate 30. In one embodiment, the silicon oxide layer 32a is formed to a thickness of about 70 Å to 100 Å on the semiconductor substrate 30 using a thermal oxidation process, a chemical vapor deposition (CVD) process, etc. Here, the silicon oxide layer 32a serves as a pad oxide layer. The silicon nitride layer 34a is then formed on the silicon oxide layer 32a using a low-pressure CVD (LPCVD) process, a plasma enhanced CVD (PECVD) process, etc., using, for example, an SiH2Cl2 gas, an SiH4 gas, an NH3 gas, etc. Here, the silicon oxide layer 32a serves as a hard mask layer. Further, in one embodiment, the silicon nitride layer 34a may be formed to a thickness greater than that of the ultimately formed floating gate electrode.

Figure 3B:
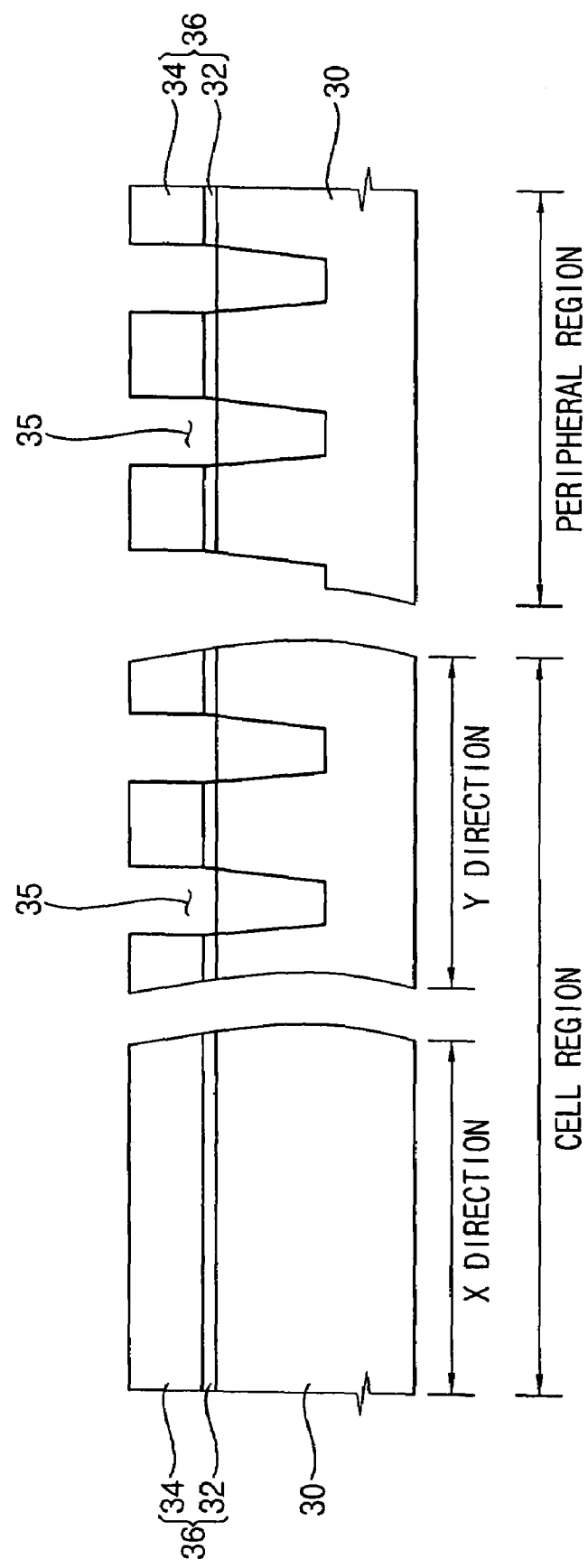

Referring to FIG. 3B, a photoresist pattern (not shown) may be used to selectively expose the insulation layer 36a using a photolithography process. In particular, the photoresist pattern may be used to partially expose and pattern the insulation layer 36a in the Y direction.

The exposed portions of the insulation layer 36a may then be etched using the photoresist pattern as an etching mask to thereby form an insulation layer pattern 36 having openings 35 that selectively expose semiconductor substrate 30. In the illustrated example, the insulation layer pattern 36 comprises the pad oxide layer 32 formed from the silicon oxide layer 32a, and the hard mask layer 34 formed from the silicon nitride layer 34a. Following formation of the insulation layer pattern 36, the photoresist pattern is removed by a stripping process using an oxygen plasma.

Figure 3C:
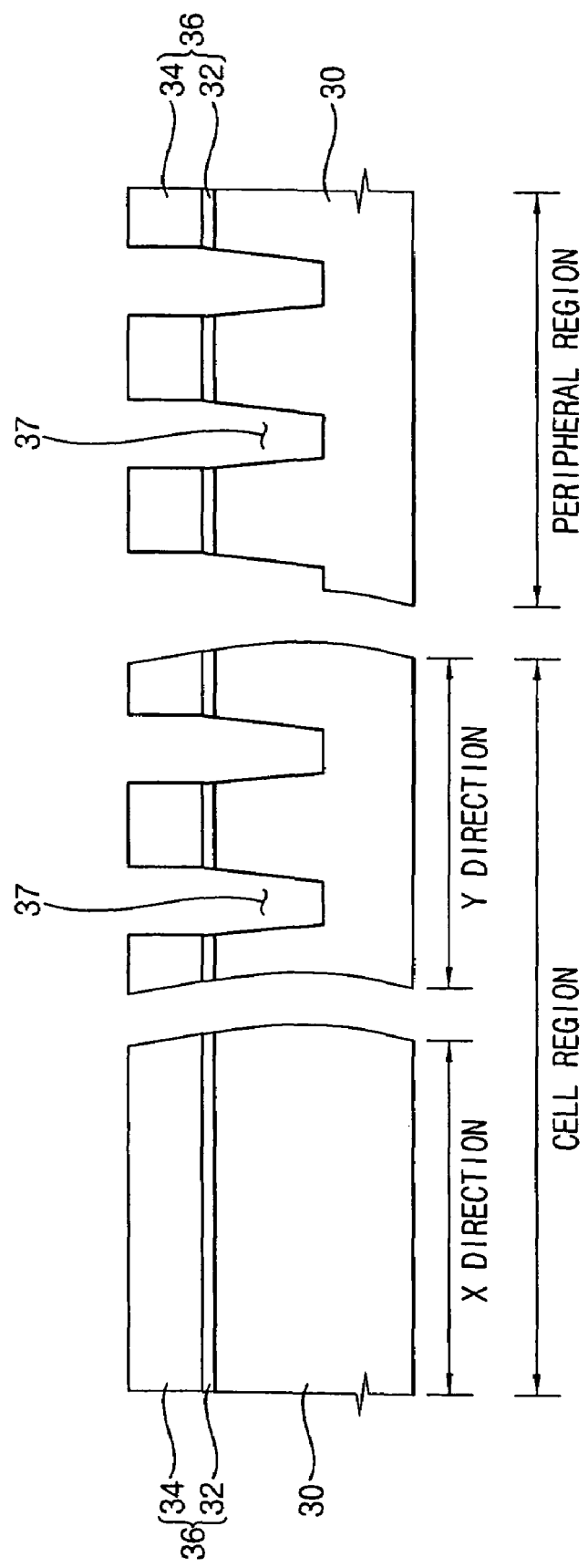

Referring to FIG. 3C, the portions of the semiconductor substrate 30 exposed through the openings 35 are etched using the insulation layer pattern 36 as an etching mask to form corresponding trenches 37 in the semiconductor substrate 30.

In relation to this particular fabrication process, any damages to the sidewall and bottom surfaces of the trenches 37 generated during their fabrication may be remedied by application of an oxide layer (not shown). Further, a nitride layer (not shown) may be also formed on the sidewall and bottom surfaces of the trenches 37 using, for example, a CVD process, to form a barrier that prevents the intrusion of foreign substances into the semiconductor substrate 30 through these surfaces.

Figure 3D:
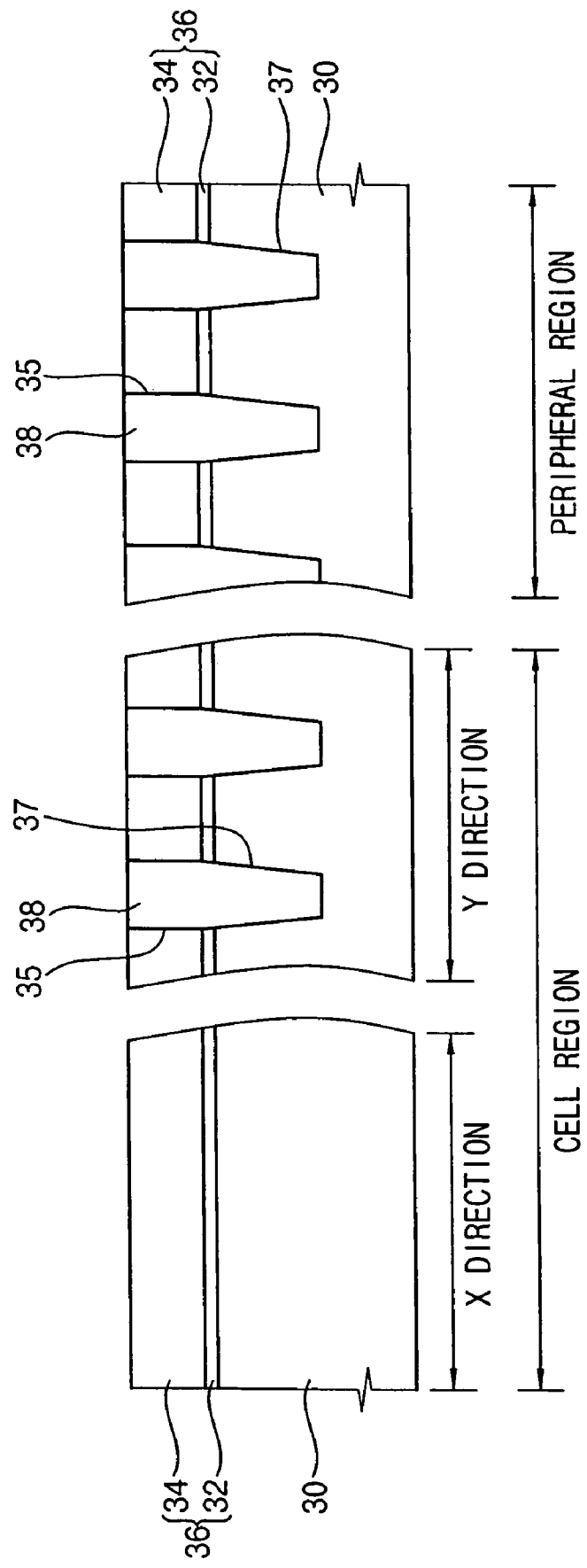

Referring to FIG. 3D, the trenches 37, as defined by the openings 35, are then filled with an insulation material. For example, the trenches 37 may be filled with the insulation material using a stacking process and a planarizing process. In one embodiment, a selected insulation material is formed on the insulation layer pattern 36 to fill the trenches 37. Thereafter, the insulation material is removed using an etch-back process or a chemical mechanical polishing (CMP) process to the point where the surface of the insulation layer pattern 36 is exposed to form filled and planarized trench structures 38. In order to properly fill the trenches 37, an insulation material having good gap-filling properties should be used. For example, silicon oxide formed by a high-density plasma process may be used as the insulation material.

Figure 3E:
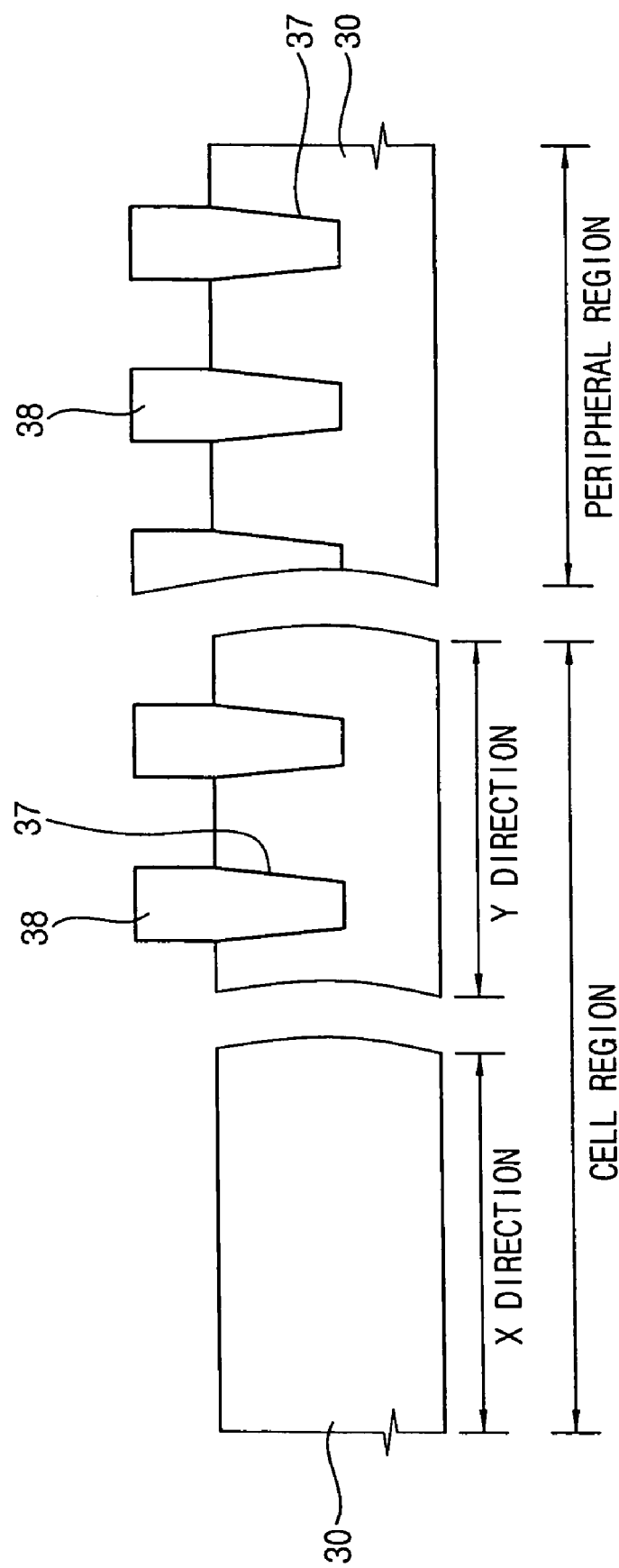

Referring to FIG. 3E, the insulation layer pattern 36 is then removed to expose portions of the semiconductor substrate 30 between the trench structures 38. The insulation layer pattern 36 may be removed in one embodiment with a wet etching process using a phosphorous acid solution. The phosphorous acid solution has an etching selectivity between the material used to form the insulation layer pattern 36 and the material used to form trench structures 38. Thus, in the illustrated example, the hard mask layer 34 and the pad oxide layer 32 are removed, and when the pad oxide layer 32 is removed, the trench structures 38 are also partially removed. As a result, after the removal of the insulation layer pattern 36, the height of the trench structures 38 may be slightly reduced, depending on the specific materials used to form the constituent layers and elements. In such circumstances, and as noted as above, it may be highly desirable to form the silicon nitride layer 34a with the thickness greater than the desired thickness for the ultimately formed floating gate electrode.

Figure 3F:
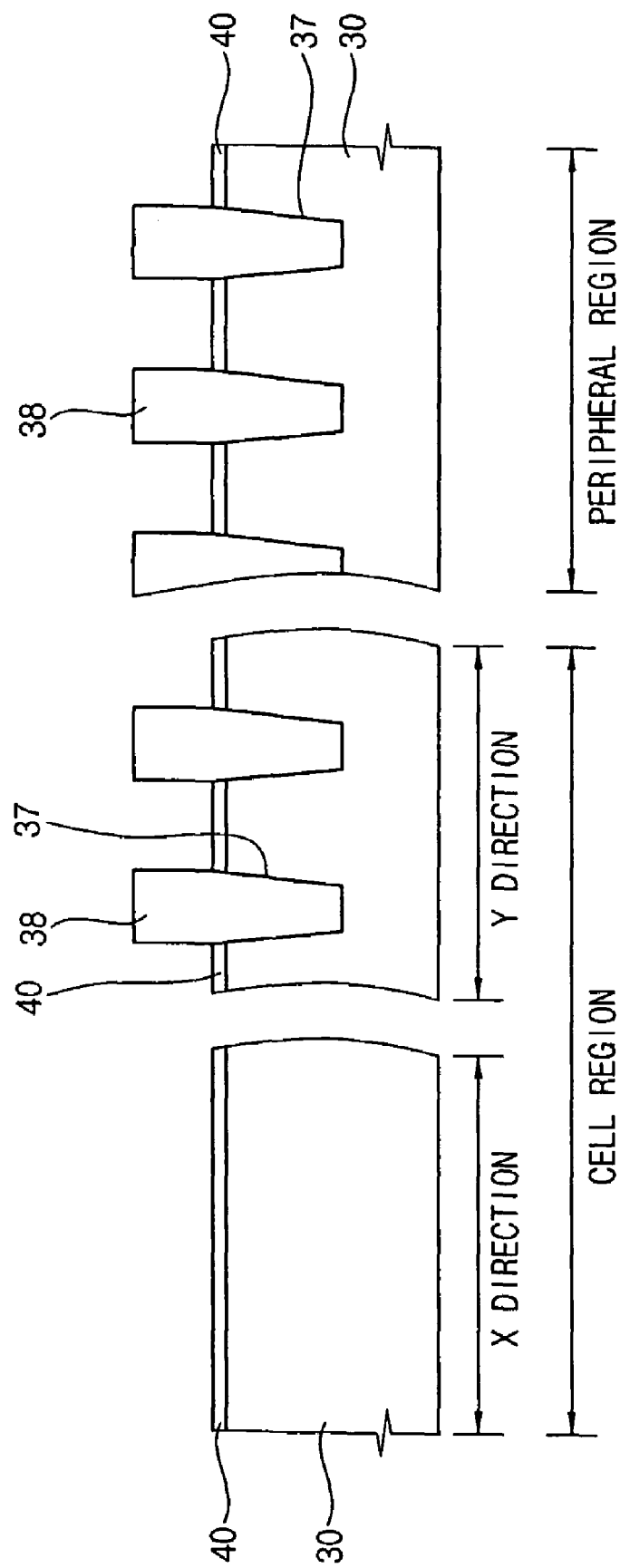

Referring to FIG. 3F, a tunnel oxide layer 40 is formed on portions of the semiconductor substrate 30 exposed through the trench structures 38. In one embodiment, the tunnel oxide layer 40 may be formed from a silicon oxide layer formed using a thermal oxidation process, a radical oxidation process, a CVD process, etc. Further, the tunnel oxide layer 40 may be formed to a thickness of about 10 Å to 200 Å. In the illustrated example, since the tunnel oxide layer 40 is formed before the formation of a trench isolation layer, thinning of the tunnel oxide layer 40 in a region adjacent to the trench isolation layer may be sufficiently suppressed.

Figure 3G:
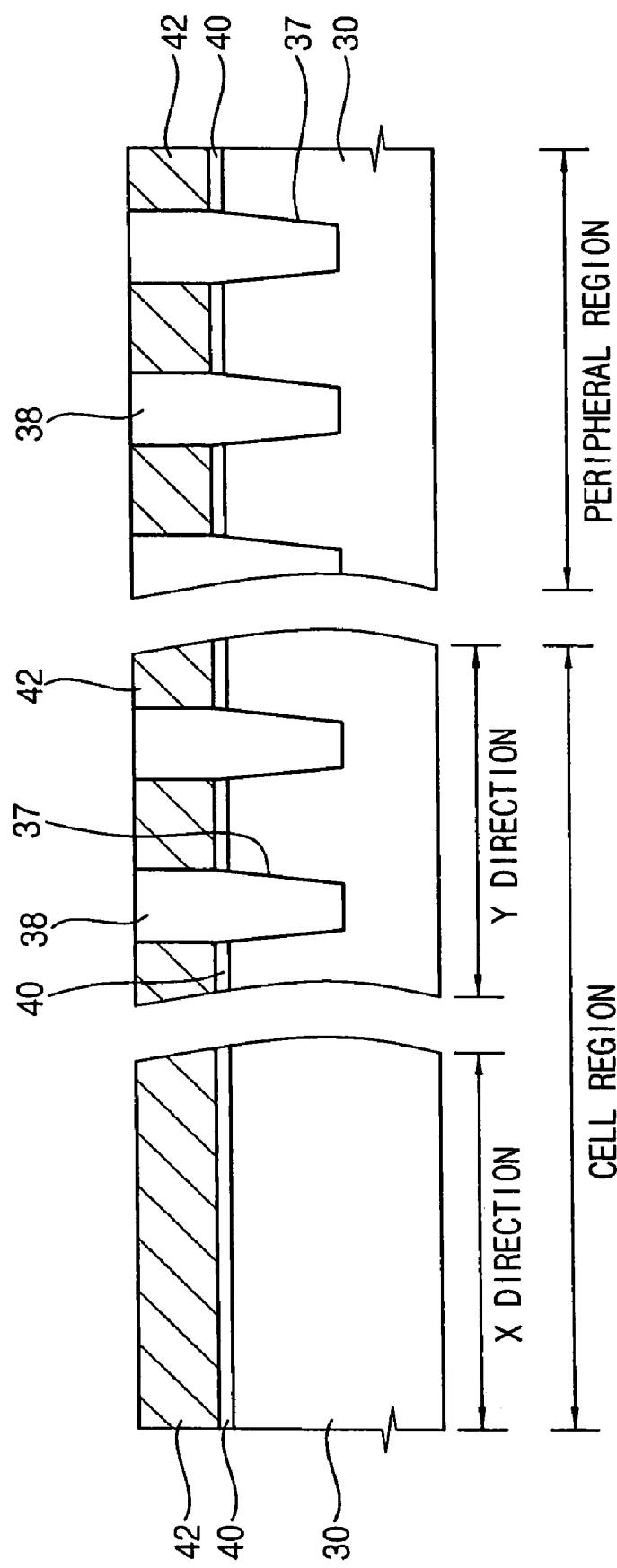

Referring to FIG. 3G, a first conductive layer 42 is formed on the tunnel oxide layer 40 and the trench structures 38. Thus, gap space between the trench structures 38 will be sufficiently filled with the first conductive layer 42. The first conductive layer 42 may then be planarized using an etch-back process or a CMP process until the surface of the trench structures 38 are exposed. As a result, the first conductive layer 42 is formed to fill the gap space between the adjacent trench structures 38. In one embodiment, the first conductive layer 42 may be formed from doped polysilicon. An exemplary process adapted to the doping of this polysilicon layer to form the first conductive layer 42 will be described in some additional detail.

The polysilicon layer is first formed by a first process and then doped by a second process. In one embodiment, the first process comprises a PECVD process and the resulting polysilicon layer will have inferior electrical characteristics. Thus, in another embodiment, the first process comprises a thermal decomposition process in which a silane (SiH4) gas is thermally decomposed in a furnace. Examples of a silane gas adapted to this use include those gases containing about 100% by volume of a silane gas, about 20% to 30% by volume of a silane gas diluted by nitrogen, etc.

Further, when the first process is carried out at a temperature of below about 500° C., the polysilicon layer is formed at a very slow deposition rate. In contrast, when the first process is carried out at a temperature of above about 650° C., the polysilicon layer will be formed with bad uniformity. Thus, in many embodiments, the first process will be carried out at a temperature ranging from about 500° C. to 650° C. In one specific embodiment having a desirable deposition rate, the first process is carried out at a temperature ranging from about 500° C. to 650° C. under a pressure ranging from about 25 Pa to 150 Pa.

The second process may comprise a diffusion process, an ion implantation process, and/or an in-situ doping process adapted to dope a polysilicon layer formed by the first process with selected impurities. Examples of the impurities include phosphorous, arsenic, boron, indium, etc. For example, when a desired transistor is an NMOS transistor, the polysilicon layer may be doped with boron. On the other hand, when the desired transistor is a PMOS transistor, the polysilicon layer may be doped with phosphorous.

In various embodiments, first conductive layer 42 may be formed to a thickness ranging from about 1,000 Å to 1,500 Å, and in one specific embodiment to a thickness of about 1,300 Å. An appropriate thickness for first conductive layer 42 may be determined in accordance with the thicknesses of the subsequently formed second and third conductive layers and in accordance with a sufficient gap-filling margin between the second and third conductive layers.

Figure 3H:
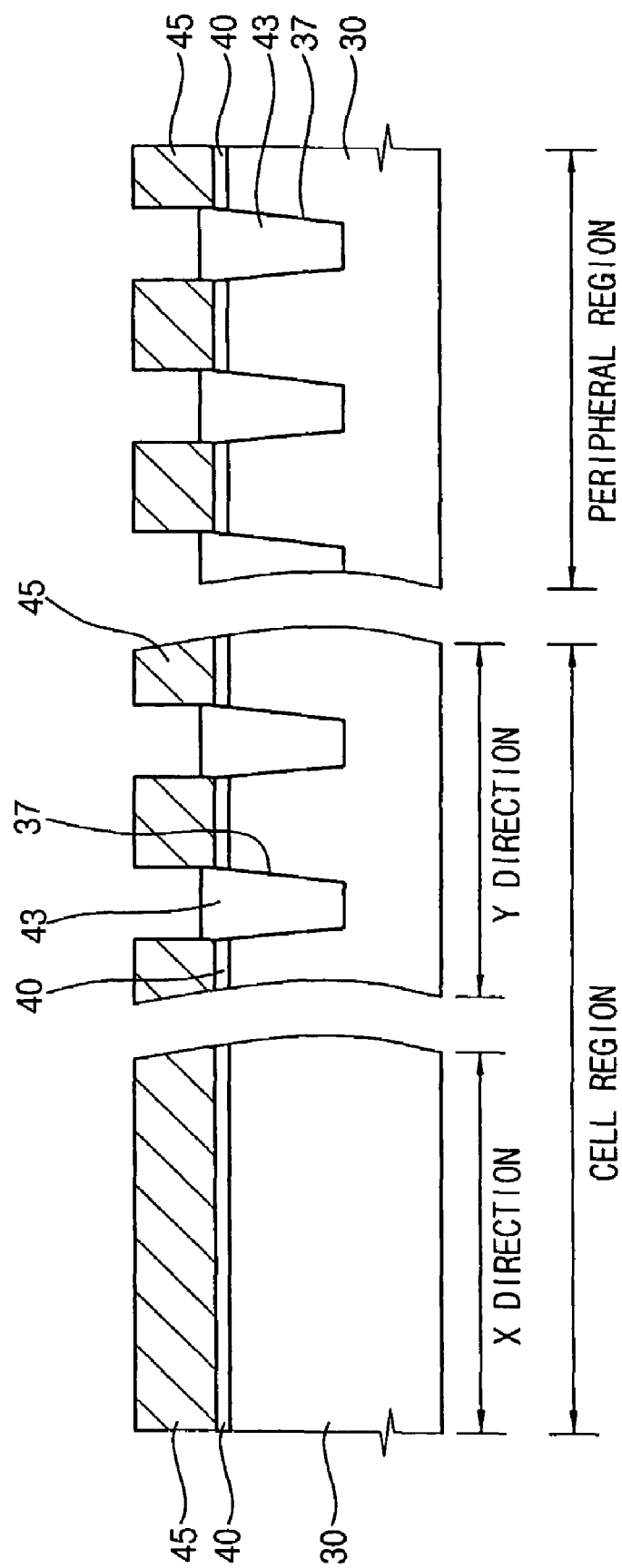
Figure 31:
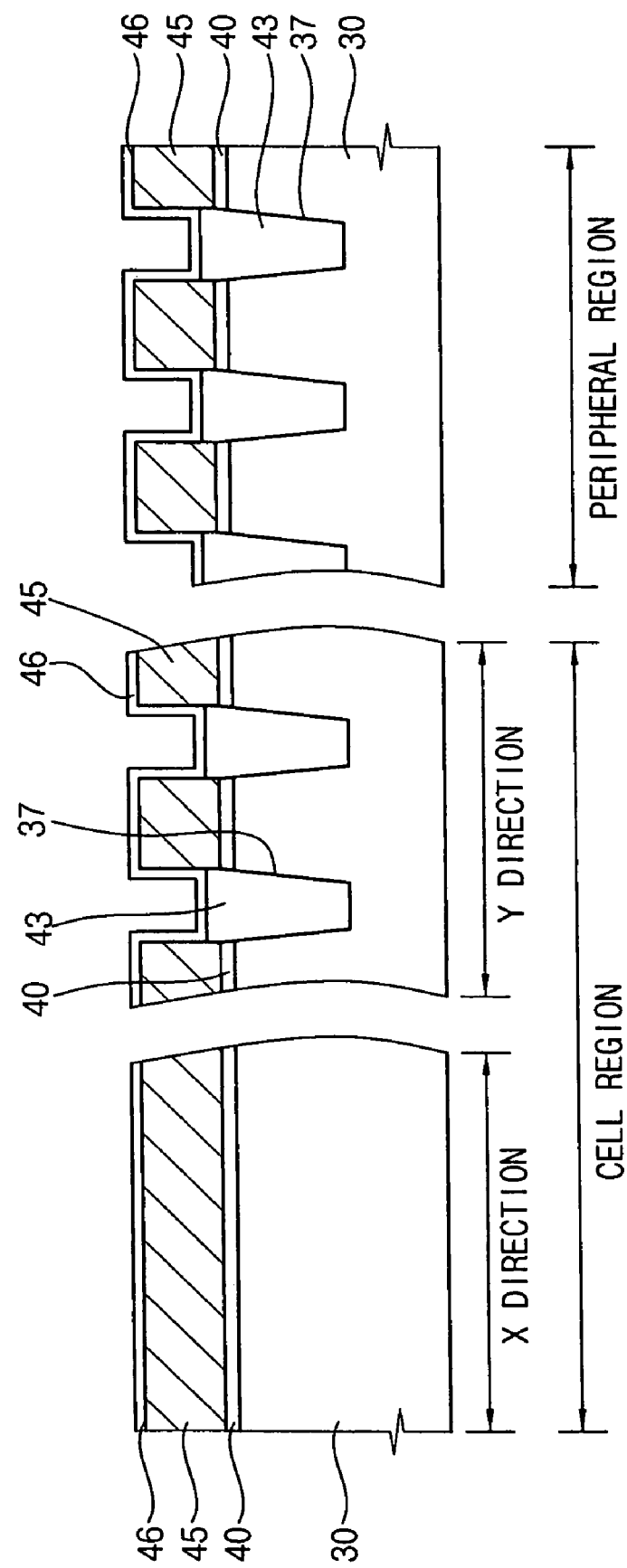

Referring to FIG. 3H, the trench structures 38 existing between portions of the first conductive layers 42 are partially removed to reduce the height profile for the trench structures 38. In this regard, the trench structures 38 may be partially removed using a wet etching process having an etching selectivity between the material used to form the trench structures 38 and the first conductive layer 42. As a result, following the reduction in the height of the trench structure 38, a first conductive layer pattern 45 is formed from first conductive layer 42. Simultaneously, trench isolation structures 43 are formed from the trench structures 38 located between adjacent elements of the first conductive layer patterns 45.

Referring to FIG. 3I, a dielectric layer 46 is formed on the first conductive layer patterns 45 and the trench isolation structures 43. Here, the dielectric layer 46 may be formed to a thickness ranging from about 150 Å to 200 Å. Further, in one embodiment, the dielectric layer 46 may comprise an oxide/nitride/oxide (ONO) structure. In one specific embodiment, the dielectric layer 46 comprises an ONO layer formed to a thickness of about 180 Å.

Alternatively, a metal oxide layer having a relatively low equivalent oxide thickness (EOT) and a high dielectric constant may be used to form dielectric layer 46. Examples of metal oxide materials adapted to this purpose include a titanium oxide, a hafnium oxide, a tantalum oxide, a zirconium oxide layer, etc. The metal oxide layer may provide performance benefits as compared to an ONO layer in view of certain device integration requirements. However, since the metal oxide layer must typically be formed using an atomic layer deposition (ALD) process, the use of a metal oxide layer over an ONO layer may also come with an increased fabrication overhead and/or productivity concerns.

Figure 3J:
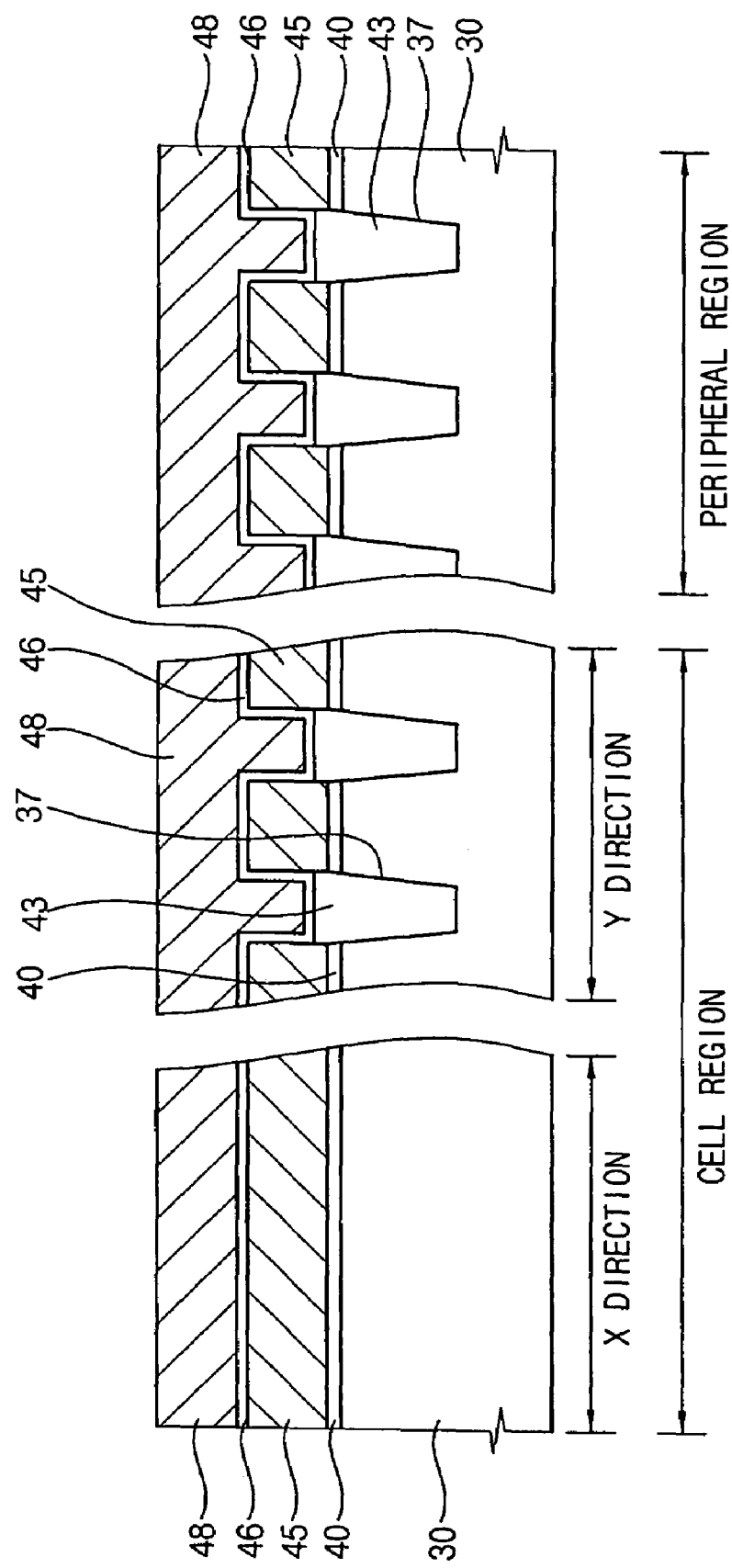

Referring to FIG. 3J, a second conductive layer 48, such as one formed from doped polysilicon is formed on the dielectric layer 46. A process adapted to the formation of the second conductive layer 48 may be substantially similar to that used in the formation of the first conductive layer 42. However, the thickness of the second conductive layer 48 may vary.

In one embodiment, the second conductive layer 48 may be formed to a thickness sufficient to fill gap space between adjacent elements in the first conductive layer pattern 45. Thus, where the second conductive layer 48 has a thickness below about 0.03 times that of the first conductive layer 42, the second conductive layer 48 may not sufficiently fill this gap space. However, where the second conductive layer 48 has a thickness above about 0.5 times that of the first conductive layer 42, a relatively high stepped portion is formed at the interface between the cell region and the peripheral region. Therefore, in many embodiments of the invention, the second conductive layer 48 will have a thickness ranging from about 0.05 times to 0.5 times that of the first conductive layer 42. In one specific embodiment, the first conductive layer 42 has a thickness ranging from about 1,000 Å to 1,500 Å, and the second conductive layer 48 has a thickness ranging from about 30 Å to 750 Å.

Figure 3K:
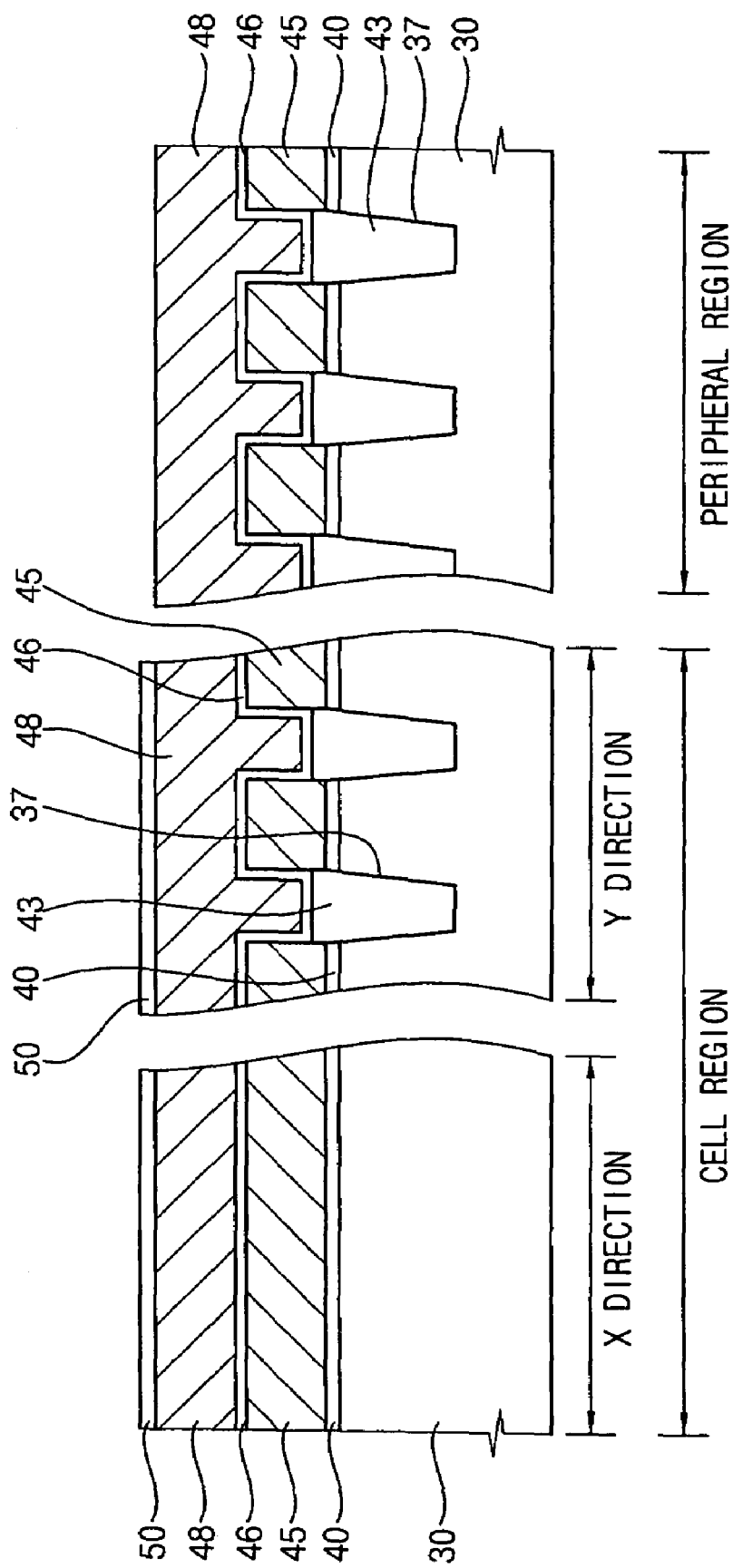

Referring to FIG. 3K, a silicon nitride layer (not shown) may be formed on the second conductive layer 48. This silicon nitride layer may then be patterned using a photolithography process using a photoresist pattern (not shown) to form a capping layer 50 selectively exposing the second conductive layer 48 in the peripheral region. That is, the capping layer 50 is formed only on the second conductive layer 48 in the cell region. The photoresist pattern is then removed by a stripping process using an oxygen plasma.

Referring to FIG. 3L, the second conductive layer 48, the dielectric layer 46, the first conductive layer pattern 45, and the tunnel oxide layer 40 are sequentially removed from the peripheral region using the capping layer 50 as an etching mask to expose the surface of the semiconductor substrate 30 in the peripheral region. Simultaneously, a portion of the trench isolation structures 43 is also removed. Here, the etching process may include a wet etching process using a phosphorous acid solution having an appropriate etching selectivity with respect to the capping layer 50.

Referring to FIG. 3M, an insulation layer 52 is formed the exposed surface of the semiconductor substrate 30 in the peripheral region. The insulation layer 52 serves as a gate insulation layer. Thus, in one embodiment, the insulation layer 52 may be formed from a silicon oxide grown using a thermal oxidation process. Here, the material used to form the capping layer 50 may be selected to suppress the growth of silicon oxide or other material used to form the insulation layer 52.

Figure 3N:
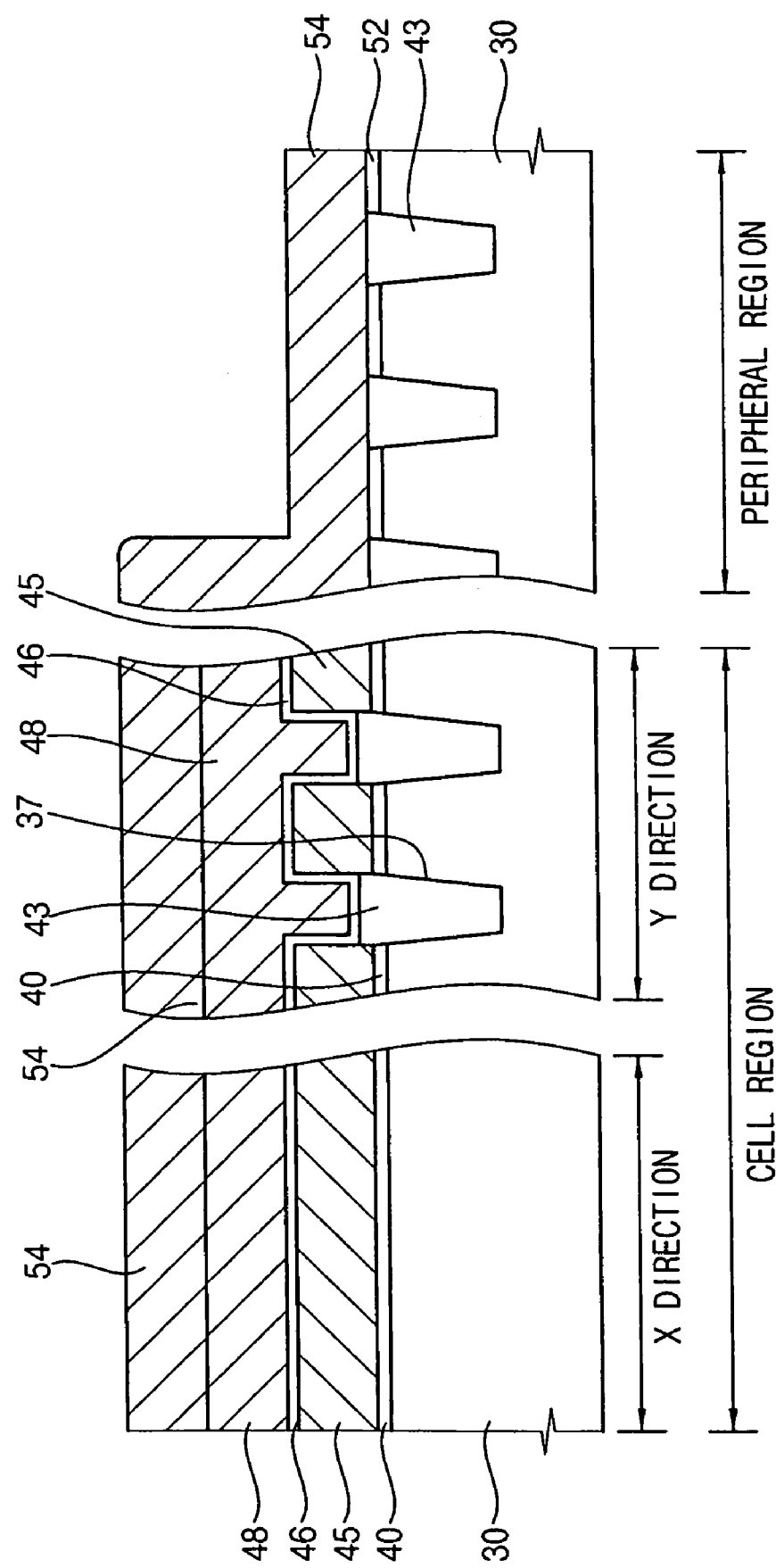
Figure 30:
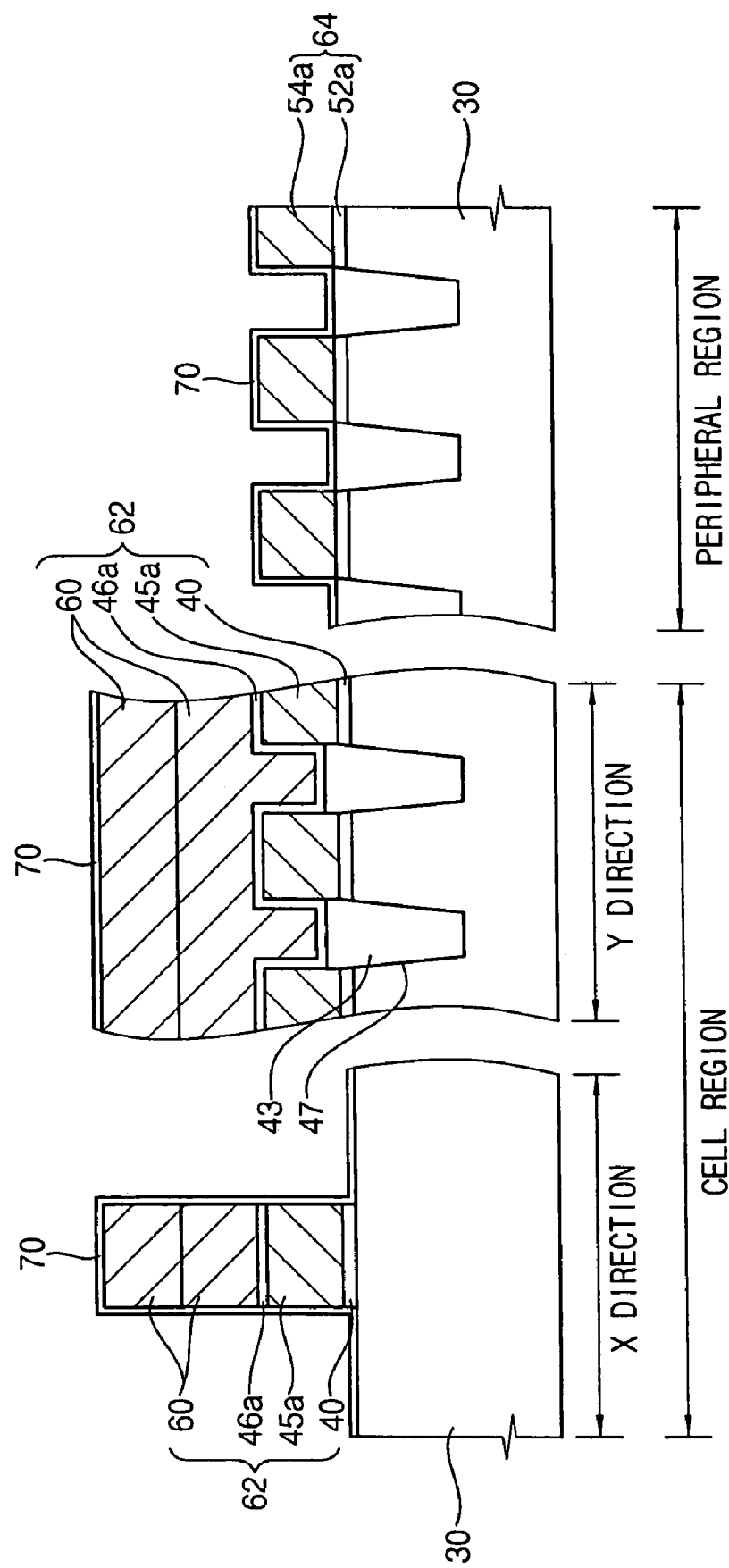

Referring to FIG. 3N, the capping layer 50 is removed from the cell region. For example, the capping layer 50 may be removed by a wet etching process using a diluted hydro fluoride solution.

An undoped third conductive layer 54 is then formed on the cell region and the peripheral region. In one embodiment, the third conductive layer 54 is formed by a thermal decomposition process in which a silane ($SiH_4$) gas is thermally decomposed in a furnace. Thus, a process for forming the third conductive layer 54 may be substantially similar to that used to form the first conductive layer 42, except the thickness of the third conductive layer 54 may differ. In one specific embodiment, the silane gas is thermally decomposed at a temperature ranging from about 500° C. to 650° C. under a pressure ranging from about 25 Pa to 150 Pa to form a polysilicon layer as the third conductive layer 54.

Particularly, since the control gate electrode comprises the second conductive layer 48 and the third conductive layer 54, the thickness of the third conductive layer 54 may be determined in accordance with the thickness of the second conductive layer 48 and the thickness of the control gate electrode. For example, where the thickness of the control gate electrode is about 2,000 Å and the thickness of the second conductive layer 48 is about 500 Å, the thickness of the third conductive layer 54 is about 1,500 Å.

In the illustrated example, a control gate electrode, as the first gate structure formed in the cell region, comprises the second conductive layer 48 and the third conductive layer 54. Further, a gate conductive layer for the second gate structure in the peripheral region comprises the third conductive layer 54. Thus, the portion of the third conductive layer 54 formed at the interface between the cell region and the peripheral region will have a stepped portion characterized by a relatively low height. That is, the height of the stepped portion may be reduced by the thickness of the second conductive layer 48.

Referring to FIG. 3O, a patterning process may be carried out on the cell region and the peripheral region. The patterning process may include a photolithography process using a photoresist pattern.

After completing the patterning process on the cell region, a first gate structure 62 is formed on the semiconductor substrate 30 in the cell region. The first gate structure 62 comprises the tunnel oxide layer 40, the floating gate electrode 45a corresponding to the first conductive layer pattern 45, a dielectric layer pattern 46a, and the control gate electrode 60 formed from the second and third conductive layers 48 and 54.

After completing the patterning process on the peripheral region, a second gate structure 64 is formed on the semiconductor substrate 30 in the peripheral region. The second gate structure 64 comprises a gate insulation layer 52a corresponding to the insulation layer 52, and a gate conductive layer 54a formed from the third conductive layer 54.

A portion of the control gate electrode 60 of the first gate structure 62 and the gate conductive layer 54a of the second gate structure 64 are doped with impurities. Here, a portion of the control gate electrode 60 corresponds to a pattered portion of the third conductive layer 54. Since portions of the control gate electrode 60 of the first gate structure 62 and the gate conductive layer 54a of the second gate structure 64 are formed from the undoped third conductive layer 54, the portion of the control gate electrode 60 and the gate conductive layer 54a may be doped with the impurities to improve electrical characteristics of the control gate electrode 60 and the gate conductive layer 54a.

Here, the doping process may include an ion implantation process, where the selection of impurities is dependent upon the nature of the second gate structure 64. For example, where the second gate structure 64 corresponds to an NMOS element, boron may be selected as a doping impurity. In contrast, where the second gate structure 64 corresponds to a PMOS element, phosphorous may be selected as a doping impurity. However, in one embodiment, both NMOS transistors and PMOS transistors are formed together in the peripheral region, and, therefore, dual ion implantation processes will be carried out using appropriate masking.

In addition, a metal silicide layer 70 may be formed on the first gate structure 62, the second gate structure 64 and the semiconductor substrate 30.

As formed on the semiconductor substrate 30, the first gate structure 62 and the second gate structure 64, the metal layer may be thermally treated to react metal in the metal layer with silicon in the semiconductor substrate 30, the first gate structure 62 and the second gate structure 64, to thereby converting the metal layer into the metal silicide layer 70. Examples of a material adapted form use as the metal layer include cobalt, tungsten, titanium, tantalum, etc. These can be used alone or in a combination. In one specific embodiment cobalt is used since the cobalt silicide layer has a resistance that may not be changed per unit area. Thermal treatment of the cobalt layer may include a first treatment performed at a temperature ranging from about 400° C. to 500° C., and a second treatment performed at a temperature ranging from about 600° C. to 900° C.

The foregoing exemplary method, in its various aspects, are well adapted to the formation of a flash memory device on the semiconductor substrate 30. The flash memory device will have a dual gate structure that comprises the first gate structure and the second gate structure where both are covered by a metal silicide layer.

According to various embodiments of the invention, the control gate electrode of the first gate structure in the cell region includes the doped conductive layer and the undoped conductive layer. Thus, the height of the stepped portion at an interface between the cell region and the peripheral region may be reduced by the height of the doped conductive layer. As a result, the fabrication method need not include an addition process adapted to partially remove the stepped portion in an attempt to improve productivity of the flash memory device.

Further, the amount of foreign substances (e.g., contamination particles) accumulating in the interface void thus formed may be remarkably reduced so that corresponding failures may be greatly reduced. As a result, the flash memory device provided by the present invention will enjoy improved reliability.

Having described several embodiments of the invention, it is noted that modifications and variations may be made by persons skilled in the art in light of the above teachings. It is therefore to be understood that such changes may be made in the illustrated embodiments without removing such from the scope of the invention as defined by the appended claims.

What is claimed is:

1. A method of manufacturing a flash memory device, comprising:

forming an insulation layer pattern on a substrate comprising a cell region and a peripheral region, the insulation layer pattern comprising openings selectively exposing portions of the substrate;

etching the exposed portions of the substrate to form trenches;

filling the trenches with an insulation material to form trench structures;

removing the insulation layer pattern to expose the surface of the substrate between the trench structures;

forming a tunnel oxide layer on the exposed surface of the substrate;

filling a gap space between the trench structures by forming a first conductive layer on the tunnel oxide layer;

partially removing the trench structures to form trench isolation structures and to form a conductive layer pattern from the first conductive layer;

forming a dielectric layer on the first conductive layer pattern and the trench isolation structures;

forming a doped second conductive layer on the dielectric layer to fill gap space between adjacent elements in the first conductive layer pattern;

removing the second conductive layer, the dielectric layer, the first conductive layer pattern and the tunnel oxide layer in the peripheral region to expose the surface of the substrate;

forming an insulation layer on the exposed surface of the substrate in the peripheral region;

forming a un-doped third conductive layer on the second conductive layer in the cell region, and on the insulation layer and the trench isolation structures in the peripheral region; and forming a first gate structure in the cell region and a second gate structure in the peripheral region, wherein the first gate structure comprises the tunnel oxide layer, a floating gate electrode corresponding to the first conductive layer pattern, a dielectric layer pattern, and a control gate electrode comprising the second and third conductive layers, and the second gate structure comprising a gate insulation layer corresponding to the insulation layer and a gate conductive layer comprising the third conductive layer.

2. The method of claim 1, wherein the insulation layer pattern comprises a multi-layered structure comprising sequentially formed silicon oxide and silicon nitride layers.

3. The method of claim 1, wherein the first conductive layer comprises a doped polysilicon.

4. The method of claim 3, wherein the first conductive layer has a thickness ranging from about 1,000 Å to 1,500 Å.

5. The method of claim 1, wherein the dielectric layer comprises a multi-layered structure comprising an oxide/nitride/oxide layer.

6. The method of claim 5, wherein the dielectric layer has a thickness of ranging from about 150 Å to 200 Å.

7. The method of claim 1, wherein the second conductive layer has a thickness ranging from about 0.03 times to 0.5 times that of the first conductive layer.

8. The method of claim 1, wherein the second conductive layer comprises polysilicon.

9. The method of claim 8, wherein the second conductive layer has a thickness ranging from about 30 Å to 750 Å.

10. The method of claim 1, wherein the third conductive layer comprises a polysilicon.

11. The method of claim 1, wherein the gate insulation layer comprises a silicon oxide.

12. The method of claim 1, further comprising forming a capping insulation layer on the second conductive layer in the cell region.

13. The method of claim 12, wherein the capping layer comprises a silicon nitride.

14. The method of claim 1, further comprising forming a metal silicide layer on the control gate electrode of the first gate structure, the gate conductive layer of the second gate structure.

15. The method of claim 14, wherein forming the metal silicide layer comprises:

forming a metal layer on the control gate of the first gate structure, and the gate conductive layer of the second gate structure; and thermally treating the metal layer to react metal in the metal layer with silicon in the control gate electrode and the gate conductive layer.

16. The method of claim 15, wherein the metal layer comprises at least one of material comprising cobalt, tungsten, or tantalum.

17. A method of manufacturing a flash memory device, comprising:

forming an insulation layer pattern on a substrate comprising a cell region and a peripheral region, the insulation layer pattern comprising openings selectively exposing portions of the substrate;

etching the exposed portions of the substrate to form trenches;

filling the trenches with an insulation material to form trench structures;

removing the insulation layer pattern to expose the surface of the substrate between the trench structures;

forming a tunnel oxide layer on the exposed surface of the substrate;

filling a gap space between the trench structures by forming a first conductive layer on the tunnel oxide layer;

partially removing the trench structures to form trench isolation structures and to form a conductive layer pattern from the first conductive layer;

forming a dielectric layer on the first conductive layer pattern and the trench isolation structures;

forming a doped second conductive layer on the dielectric layer to fill gap space between adjacent elements in the first conductive layer pattern;

removing the second conductive layer, the dielectric layer, the first conductive layer pattern and the tunnel oxide layer in the peripheral region to expose the surface of the substrate;

forming an insulation layer on the exposed surface of the substrate in the peripheral region;

forming a un-doped third conductive layer on the second conductive layer in the cell region, and on the insulation layer and the trench isolation structures in the peripheral region;

forming a first gate structure in the cell region and a second gate structure in the peripheral region, wherein the first gate structure comprises the tunnel oxide layer, a floating gate electrode corresponding to the first conductive layer pattern, a dielectric layer pattern, and a control gate electrode comprising the second and third conductive layers, and the second gate structure comprising a gate insulation layer corresponding to the insulation layer and a gate conductive layer comprising the third conductive layer;

doping the control gate and the gate conductive layer with impurities; and, forming a silicon nitride capping insulation layer on the second conductive layer in the cell region.

18. The method of claim 17, wherein doping the control gate and the gate conductive layer with the impurities comprises performing at least one ion implantation process.

19. The method of claim 17, further comprising forming a metal silicide layer on the control gate electrode of the first gate structure, the gate conductive layer of the second gate structure.

20. The method of claim 19, wherein forming the metal silicide layer comprises:

forming a metal layer on the control gate of the first gate structure, and the gate conductive layer of the second gate structure; and thermally treating the metal layer to react metal in the metal layer with silicon in the control gate electrode and the gate conductive layer.

* * * * *